United States Patent
Gueguen et al.

(10) Patent No.: US 7,127,443 B2
(45) Date of Patent: Oct. 24, 2006

(54) ADAPTIVE TURBO-CODING AND DECODING

(75) Inventors: Arnaud Gueguen, Rennes (FR); David Mottier, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 245 days.

(21) Appl. No.: 09/926,498

(22) PCT Filed: Mar. 9, 2001

(86) PCT No.: PCT/JP01/01875

§ 371 (c)(1),
(2), (4) Date: Nov. 13, 2001

(87) PCT Pub. No.: WO01/69795

PCT Pub. Date: Sep. 20, 2001

(65) Prior Publication Data

US 2003/0061190 A1    Mar. 27, 2003

(30) Foreign Application Priority Data

Mar. 13, 2000    (FR) .................................. 00 03339

(51) Int. Cl.
*G06F 7/00*    (2006.01)
*H03M 13/00*    (2006.01)

(52) U.S. Cl. .............................. 707/1; 707/10; 714/758

(58) Field of Classification Search ................ 707/101, 707/104.1; 714/780, 794–796, 775, 776, 714/786, 790, 755; 341/95, 81
See application file for complete search history.

(56) References Cited

U.S. PATENT DOCUMENTS 6,014,411 A * 1/2000 Wang .......................... 375/259

(Continued)

FOREIGN PATENT DOCUMENTS

DE    197 36 653    12/1998
GB    2 160 392     12/1985

OTHER PUBLICATIONS

Charles C. Wang, IEEE Military Communication Conference Proceedings, pp. 987-992, "On the Performance of Turbo Codes", Oct. 18-21, 1998.

Fan Mo, et al., IEEE Military Communication Conference Proceedings, pp. 547-550, "Analysis of Puncturing Pattern for High Rate Turbo Codes", Oct. 31, 1999.

(Continued)

*Primary Examiner*—Uyen Le
*Assistant Examiner*—Susan Y. Chen
(74) *Attorney, Agent, or Firm*—Oblon, Spivak, McClelland, Maier & Neustadt, P.C.

(57) ABSTRACT

A digital transmission method includes detecting a parameter of the transmission conditions, selecting a distribution of elementary coding step redundancies from a plurality of distributions of elementary coding step redundancies for which the global efficiency is equal to a target efficiency, performing a coding procedure including elementary coding steps with corresponding puncturing steps, and an interleaving step between the elementary coding steps, each of the elementary coding steps adding a redundancy by utilizing the distribution of elementary coding step redundancies, to a useful information to generate a coded information with a redundancy for a transmission, and performing a decoding procedure including elementary decoding steps, deinterleaving and depuncturing steps, and puncturing and interleaving steps corresponding to the elementary decoding steps to obtain an estimation of the useful information item.

10 Claims, 4 Drawing Sheets

U.S. PATENT DOCUMENTS 6,370,669 B1 * 4/2002 Eroz et al. .................. 714/774
6,389,574 B1 * 5/2002 Belveze et al. ............. 714/795
6,396,423 B1 * 5/2002 Laumen et al. ............... 341/95
6,888,804 B1 * 5/2005 Moon ......................... 370/311

OTHER PUBLICATIONS

O. F. Acikel, et al., IEEE, vol. CONF. 5, pp. 422-427, "High Rate Turbo Codes for BPSK/QPSK Channels", Jun. 7, 1998.

* cited by examiner

ADAPTIVE TURBO-CODING AND DECODING

TECHNICAL FIELD

The present invention concerns in general terms a digital transmission method of the error correction coding type, notably for a system for digital transmission over a channel with a large amount of interference. More precisely, it concerns an improvement to a digital transmission method, of the error correction coding type, using notably coding schemes of the turbocode type with serial concatenation, allowing adaptation to the transmission conditions.

BACKGROUND ART

A digital transmission system conveys information using a physical medium such as a cable, optical fiber or propagation on a radio channel and satellite. Such a physical medium will be referred to as the channel. Generally, such a system includes a channel coding device and a decoding device.

The channel coding device has an error correction coding function. The function of the error correction coding includes generating, for a useful information item, a redundant information item which, during decoding at the destination, will make it possible to reconstruct the useful information from the information arriving at its destination affected by disturbance such as the noise, attenuation and interference type occurring on the channel. A digital transmission method using such a channel coding and destination decoding is referred to as a transmission method of the error correction coding type.

The quality of a digital transmission system is evaluated, in general, by calculating the probability of error per bit transmitted. This is notably a function of the signal to noise ratio of the link. The error correction coding, associated with the corresponding decoding, aims to improve the quality of the transmission by virtue of the redundancy introduced into the signal. Redundant information having been introduced by the coding device, the decoding device will use the redundant information received and its knowledge of the coding law in order to correct any errors. In other words, at the destination, from the received information damaged by the channel, the corresponding useful information is reconstructed. For example, because of the redundancy, only certain sequences of coded information, in accordance with the coding law, are possible. If received information sequences to be decoded are different from these possible sequences, it is because they correspond to information damaged by the channel. In the case of a maximum likelihood decoding, the decoding method will reconstruct the useful information by determining, from the sequence of information received and considering the different permitted sequences, the most likely useful information sequence.

The greater the ability to discriminate between the sequences allowed by all the coding operations, the greater the error correction capability.

An important consequence of the redundancy introduced by the coding is the increase in the digital flow rate. An important parameter of the coder is therefore its efficiency, which is equal to the number of information bits per bit transmitted. In general, the lower the efficiency, the more robust the code.

The performance of a transmission with error correction coding is generally measured in terms of bit error ram or packets for a given ratio $E_b/N_o$, where $E_b$ is the energy per information bit and $N_o$ is the power spectral density of the noise. A code is deemed to be more or less efficient depending on whether its use allows a more or less low error rate for a given ratio $E_b/N_o$ and for a given decoding complexity.

It is possible to improve the performance by using a code of lower efficiency. However, this is done to the detriment of the spectral efficiency of the transmission. Generally, the efficiency used is the efficiency making it possible to guarantee a predetermined error rate, this efficiency possibly being able to change according to the transmission conditions.

Known error correction codes are block codes. Block coding consists of associating, with each block of k information bits, a block of n bits (n>k) therefore containing (n−k) redundant bits. The block of n bits is obtained by multiplying the block of k useful bits by a matrix with k rows and n columns referred to as a code generating matrix. When, by permutation, the generating matrix is written in a form such that it reveals the identity matrix, so that, in the block of n bits, the k information bits and the n−k redundant bits are separated, the code is said to be systematic. The efficiency of the code is equal to k/n. The decoding device detects the errors and corrects them by means of the minimum Hamming distance. Such error defection codes which are well known in the art are for example Hamming codes, BCH codes and Reed-Solomon codes.

Effecting an error correction coding by means of one or more convolutional coders is also well known. Their operating principle consists of coding a block of k binary elements present at the input of the coder as a block of n binary elements taking account also of m blocks preceding the block at the input, by means of a register device. The output of the convolutional coder consists of n coded binary elements generated by the convolution product of the k binary elements present at the input with the response of the coder defined by n generator polynomials. The number n of generator polynomials of the coder is referred to as the dimension of the coder. The efficiency of the code is equal to k/n. The decoding device reconstructs the original data, for example by means of a decoding of the sequential type, a decoding according to the most likely symbol, or a decoding according to the most likely sequence, as described, for example, in the document "Digital Communications" by J. G. Proakis, published in 1995 by MacGraw-Hill. For example, the Viterbi algorithm provides an optimal decoding according to the most likely sequence.

According to a variant of this type of code, the coding is done not by taking directly into account a series of m useful information items preceding the information to be coded, but using a series of m auxiliary information items, stored in a device of the shin register type each obtained by the mathematical combination of a useful information item and m previously calculated auxiliary information items. Such a convolutional code is said to be recursive. When, in addition, the useful information appears as it is amongst the n outputs of the coder alongside (n−I) coded information items or redundant information items, the resulting code is referred to as a systematic recursive convolutional code, or RSC code.

Associating different coders in order to increase the performance of the coding is also known. For example, the data coded by a first coder can feed a second coder. Decoding takes place symmetrically, commencing with the second code.

A high-performance type of association of coders has been proposed, as described notably in the document "Near Shannon Limit Error-Correcting Coding and Decoding:

Turbo-codes" by C. Berrou, A. Glavieux, P. Thitimajshima, which appeared in ICC-1993, Conference Proceedings, on pages 1064–1070. This type of combination of coders has given rise to a family of coding schemes known in the art as turbocodes. The term turbocodes will be applied to error correction codes based on the combination, referred to as concatenation, of several single codes, referred to as elementary codes, with the intervention of permutation operations, referred to as interleavings, which modify the order in which the data are taken into account by each of the single codes. Elementary codes means codes introducing a redundancy, of the type described above. It may be a case, for example, of systematic recursive convolutional codes for convolutional turbocodes, Hamming block or BCH codes for block turbocodes. Different types of concatenation can be envisaged. In parallel concatenation, the same information is coded by each coder separately after having been interleaved. In serial concatenation, the output of each code is coded by the following coder after having been interleaved. The dimension of the turbocode means the number of elementary coders used for implementing this turbocode. A well-known turbocoding scheme consists of a parallel concatenation of elementary codes of the Systematic Recursive Convolutional Code (RSC) type. This turbocode is referred to as PCCC. Examples of serial concatenation turbocodes arc SCCCs which use elementary codes of the convolutional code type, and block turbocodes which use elementary codes of the block code type. Serial concatenation turbocodes are described in particular in the articles "Serial concatenation of interleaved codes: Performance analysis, design and iterative decoding" written by S. Benedeno, G Montorsi, D. Divsalar and F. Pollara, in JPL TDA Prog. Rep., vol. 42–126, in August 1996 and "Analysis Design and Iterative Decoding of Double Serially Concatenated Codes with Iderleavers" written by S. Benedetto, D. Divsalar, G. Montorsi and F. Pollara, in IEEE JOURNAL ON SELECTED AREAS IN COMMUNICATIONS, vol 16, No 2, pages 231–244 in February 1998.

Information coded by a turbocode can be decoded by an iterative method referred to hereinafter as turbodecoding. In order to effect this turbodecoding, several elementary decoders with weighted inputs and outputs each corresponding to an elementary coder of the coding device are combined. The weighted inputs and outputs are effected in terms of probabilities, likelihood ratios or log likelihood ratios. Interleavers and deinterleavers enable each decoder to take into account an item of information which is presented in the same order as a corresponding item of information at the output or input of the corresponding coder. Each elementary decoder receive an item of information corresponding to an item of information output from the corresponding coder and an item of information corresponding to input information of the corresponding coder, and generate information of increased reliability. The supplementary information generated by an elementary decoder is referred to as the extrinsic information. It is used by one or more other elementary decoders after adapted interleaving or deinterleaving. The exchange of extrinsic information takes place between elementary decoders within the same step, and from this step to the following step. Each new step therefore increases the reliability of the information generated at the output. The elementary decoders use for example MAP, LogMAP, Max-LogMAP, SOYA, or Chase algorithms which are described, for example, in the articles "Optimal and sub-optimal maximum a posteriori algorithms suitable for turbo decoding" by P. Robertson, P. Hoeher and E. Villebrun, which appeared in European Trans. on Telecommun., vol. 8, March-April 1997, on pages 119–125 and "A very low complexity block turbo decoder for product codes" by R. Pyndiah, P. Combelles and P. Adde, which appeared in Proc. IEEE Globecom 1996, on pages 101–105. A thresholding is applied to the information output from the last decoding step in order to generate the decoded information.

The term turbodecoding encompasses various concatenation schemes which can be envisaged, dependent for example on the type of turbocoding used. For example, in a turbodecoding corresponding to a serial concatenation turbocode, the elementary decoders being associated in reverse order of the elementary coders, each elementary decoder receives two priori weighted information items corresponding one to the output information from the corresponding elementary coder and the other to the input information of the corresponding elementary coder. This elementary decoder produces two posterior weighted information items, one corresponding to the output of the corresponding elementary coder and which therefore becomes, during a following iteration, after corresponding interleaving, the priori input of a preceding elementary decoder, and the other corresponding to the input of the corresponding elementary coder, and which therefore becomes, in the same iteration, after corresponding deinterleaving, the priori input of a following elementary decoder. Examples of turbodecoding for serial concatenation turbocodes are described notably in the aforementioned articles "Serial concatenation of interleaved codes: Performance analysis, design and iterative decoding" written by S. Benedetto, G Montorsi, D. Divsalar and F. Pollara, in JPL TDA Prog. Rep., vol. 42–126, in August 1996 and "Analysis Design and Iterative Decoding of Double Serially Concatenated Codes with Interleavers" written by S. Benedetto, D. Divsalar, G. Montorsi and F. Pollara, in IEEE JOURNAL ON SELECTED AREAS IN COMMUNICATIONS, vol 16, No 2, pages 231–244 in February 1998. The elementary decoders are in general concatenated in series, but other types of concatenation may be envisaged.

Whatever the case, the extrinsic information can always be defined as the additional information afforded by an elementary decoding associated with an elementary coding with respect to a priori information item, acting at the input of the elementary decoding.

It is also known that the efficiency of a code can be increased by a puncturing operation, which consists of not transmitting certain bits in a sequence of information, as described, for example, in the article "Rate-Compatible Punctured Convolutional (RCPC) codes and their application" by J. Hagenauer, which appeared in IEEE Trans., Vol COM-36.4, 1988, on pages 389–400 or in the article "New Rate Compatible Punctured Convolutional Codes for Viterbi Decoding" by L. H. C. Lee, which appeared in IEEE Trans., Vol. COM-42.2, 1994, on pages 3073–3079. These non-transmitted bits are in general redundant information bits. One or more puncturing operations occur at transmission, after one or more coding operations. At the destination, one or more reciprocal depuncturing operations are carried out before one or more decoding operations. The puncturing of redundant information bits reduces the correction capacity of a code and increases its efficiency.

In the case of serial concatenation turbocodes, the puncturing, on transmission, can occur after each elementary coding operation, before the interleaving operation. There will generally be, in the case of serial concatenation turbocodes, as many puncturing matrices as there are elementary coders. The efficiency of the elementary codes not generally being the same and the puncturing being generally distributed unequally, the size of a given interleaves will depend on the one hand on the efficiency of the elementary code which precedes it and on the other hand on the puncturing matrix interposed between this elementary code and this interleaves. The global efficiency of the serial turbocode will be equal to the product of the efficiencies of the elementary codes each modified by the corresponding puncturing.

The error correction codes of the family of turbocodes according to the state of the art described above make it possible to obtain very high performance error correction whilst preserving sufficiently high efficiency and allowing decoding operations of low complexity compared with the complexity of the code.

However, it is known that the performance of a transmission using an error correction code varies according to the transmission conditions. Transmission conditions means the parameters having an influence on the performance of the transmission such as in particular the signal to noise ratio, but also the bit or packet error rate, the signal to interference plus noise ratio, the number of active users of a telecommunications system, the quality of service required by the transmission system, the speed of movement of the user of the transmission system or any other parameter.

In the state of the adaptation to the transmission conditions is effected by decreasing or increasing the efficiency in order to make the code more or less robust depending on whether the channel is more or less harsh.

One object of the present invention is to allow a dynamic adaptation to the transmission conditions of an error correction code transmission method of the serial concatenation turbocode type, at constant efficiency.

DISCLOSURE OF INVENTION

To this end, it proposes a digital transmission method of the error correction coding type comprising on the one hand, before a step of transmission over a channel, a coding procedure for generating, from a useful information item, a coded information item with a certain global redundancy characterized by a global efficiency, the said coding procedure comprising at least two elementary coding steps associated with respective puncturing steps and concatenated in series, an interleaving step taking place between two successive elementary coding steps, each of the said elementary coding steps generating, from an input information item, an output information item with a certain elementary coding step redundancy, characterized by an elementary coding step efficiency modified by the corresponding puncturing, the said global efficiency being equal to the product of the efficiencies of the said elementary coding steps each modified by the corresponding puncturing, and on the other hand, after the said step of transmission over the said channel, a decoding procedure for obtaining, from an information item to be decoded, an estimation of the said useful information item by correcting transmission errors, the said decoding procedure being iterative and each of its iterations comprising elementary decoding steps corresponding to the said elementary coding steps as well as deinterleaving and depuncturing steps and puncturing and interleaving steps enabling each elementary decoding step to take into account information corresponding to the information respectively output from and input to the corresponding coder, the said transmission method being characterized in that it also comprises a step of observing the transmission conditions in order to determine at least one parameter characteristic of the transmission conditions, a redundancy distribution selection step in order to select, as a function of the said at least one parameter, a distribution of the said elementary coding step redundancies amongst a plurality of distributions of the said elementary coding step redundancies for which the said global efficiency is the same, and a step of adapting coding and decoding procedures in order to adapt the said coding procedure and the said decoding procedure as a function of the said selected redundancy distribution.

Thus, by fixing a target efficiency Rc greater than the minimum efficiency $R_m$ of the coding procedure, the distribution of the redundancy is adjusted dynamically over time in accordance with the transmission conditions in order to guarantee the best performance. As stated previously, the parameter or parameters characteristic of the transmission conditions can be the bit error rate, the packed error rate, the signal/noise ratio, the signal to interference plus noise ratio, the number of active users of a telecommunications system, the quality of service required by the transmission system, the speed of movement of the user of the transmission system or any other parameter liable to have an influence on the performance of the transmission system. This parameter or parameters can be evaluated directly at transmission, for example from measurements made on the transmitted signals. They can also be supplied by an external control signal. The plurality of redundancy distributions for each global efficiency Rc is predetermined according to a prior study of the performance of the coding as a function of the transmission conditions making it possible to determine, for each transmission condition, the redundancy distribution leading to the best performance. The puncturing schemes corresponding to the different transmissions can be stored in a look-up table.

According to another aspect of the present invention, the said step of adapting coding and decoding procedures modifies the said puncturing and interleaving steps of the said coding procedure as well as the said deinterleaving and depuncturing steps and the said puncturing and interleaving steps of the said decoding procedure as a function of the said selected redundancy distribution.

According to another aspect of the present invention, the said coding and decoding procedure adaptation step eliminates one or more elementary coding steps and the corresponding puncturing and interleaving steps of the said coding procedure, as well as the elementary decoding steps, the deinterleaving and depuncturing steps and the corresponding puncturing and interleaving steps of the said decoding procedure as a function of the said selected redundancy distribution.

Naturally, the coding and decoding procedure adaptation step can combine the two operating modes which have just been described.

The elementary coding steps can use either convolutional codes or block codes.

According to one aspect of the present invention, the said step of observing the transmission conditions and the said redundancy selection step are executed at a transmitter for which the said coding procedure is executed, the said selected redundancy distribution being transmitted to a receiver for which the said decoding procedure is executed.

Alternatively, the said step of observing the transmission conditions and the said redundancy selection step are executed both at a transmitter for which the said coding procedure is executed and at a receiver for which the said decoding procedure is executed.

Naturally, it is essential for the determination of a redundancy distribution to be the same at the transmitter as at the receiver. Thus the latter variant will be employed only when the parameters characteristic of the transmission conditions do not vary according to whether the transmitter is considered or the receiver is considered. Naturally the algorithms and/or reference tables used for determining the redundancy distribution will be identical at the transmitter and at the receiver.

BRIEF DESCRIPTION OF DRAWINGS

The characteristics of the invention mentioned above, as well as others, will emerge more clearly from a reading of the following description of an example embodiment, the description being given in relation to the accompanying drawings, amongst which.

BEST MODE FOR CARRYING OUT THE INVENTION

Overall, in a digital transmission method of the error correction coding type, the present invention makes it possible, by keeping a global efficiency constant, that is to say an efficiency equal to the product of the efficiencies of elementary coding steps modified respectively by puncturing steps, equal to a predetermined target efficiency $R_c$ greater than the minimum efficiency $R_m$ of the error correction code, to select, according to the transmission conditions, a distribution of the redundancies of the elementary coding steps amongst a plurality of redundancy distributions for which the global efficiency is equal to the target efficiency $R_c$, so that the performance of the digital transmission method with error correction coding is optimal for these transmission conditions. The modifications made with regard to the coding procedure have a corresponding effect on the decoding procedure.

The embodiments of the present invention described apply to a transmission method of the error correction coding type in which, at transmission, a coding procedure comprises n elementary coding steps associated with respective puncturing steps concatenated in series, an interleaving step occurring between two successive elementary coding steps. It may be a case notably of a transmission method using an error correction code of the serial concatenation turbocode type. The coding procedure generates, from a useful information item, a coded information item with a certain global redundancy characterised by a global efficiency. Each of the elementary coding steps generates, from an input information item, an output information item with a certain elementary coding step redundancy characterised by an elementary coding step efficiency modified by the corresponding puncturing. The global efficiency is equal to the product of the efficiencies of the elementary coding steps each modified by the corresponding puncturing.

At the destination, a decoding procedure reconstructs the information by means of n elementary decoding steps corresponding to the n elementary coding steps. The decoding procedure is iterative and each of its iterations includes n elementary decoding steps corresponding to the n elementary coding steps as well as deinterleaving and depuncturing steps and puncturing and interleaving steps enabling each elementary decoding step to take into account information corresponding to the information respectively output from and input to the corresponding coder.

Figure 1:
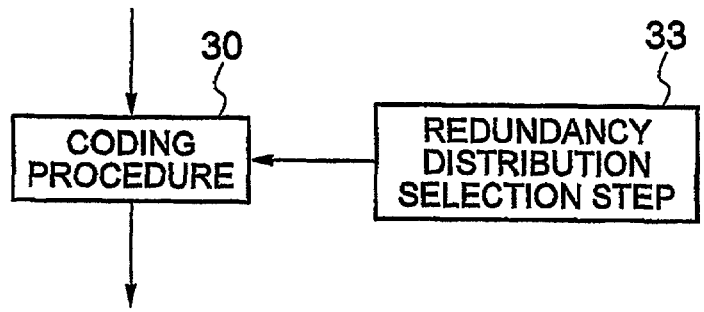
FIG. 1 is a diagram illustrating the basic principle of an embodiment of a coding procedure of a transmission method according to the present invention.
Figure 2:
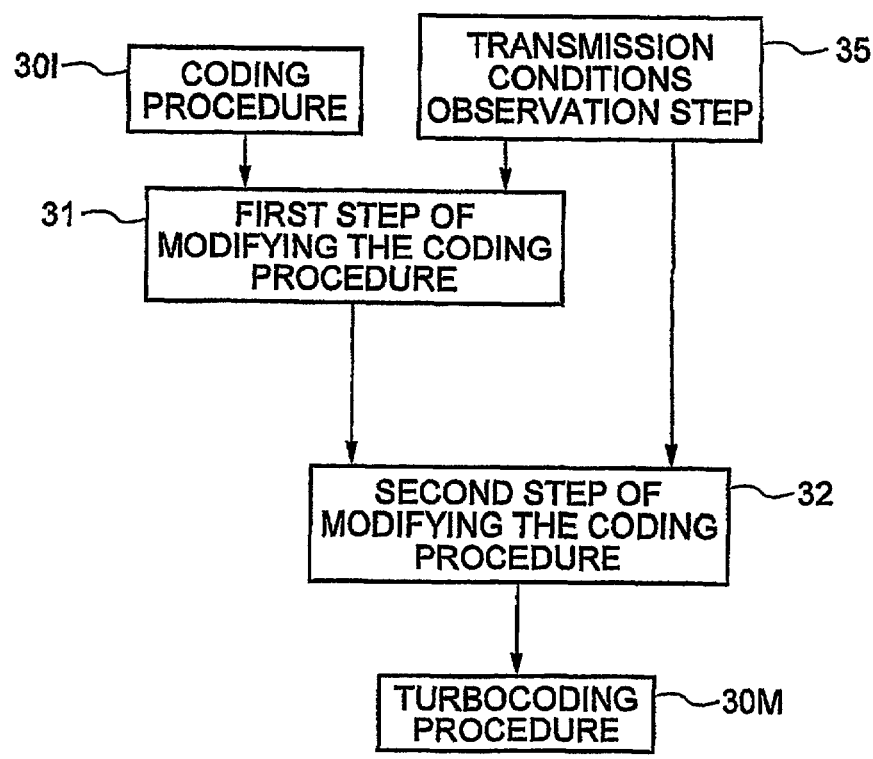
FIG. 2 is a diagram illustrating the dynamic selection of the redundancy executed in the coding procedure of FIG. 1.

FIG. 1 presents in schematic form the basic principle of an embodiment of a coding procedure of a transmission method according to the present invention. A coding procedure 30 effects the coding of useful information sequences by means of a serial turbocode. At the start, as can be seen in FIG. 2, it is a case of a coding procedure 30I with a serial turbocode with an initial dimension n and initial efficiency $R_m$. A target efficiency $R_c$ greater than $R_m$ is fixed. For this target efficiency, the redundancy can be distributed in different ways between the elementary coding steps as modified by the puncturing steps. For example, if the information sequences to be coded are sequences of bits, this gives:

$$\prod_{i=1}^{n} R_i = \prod_{i=1}^{n} \frac{N_{in,i}}{N_{out,i}} = R_c \quad (1)$$

where $N_{in,i}$ is the number of input bits of the $i^{th}$ elementary coding step, $N_{out,i}$ is the number of bits output from the puncturing step following this $i^{th}$ elementary coding step, and $R_i$ is the efficiency of the $i^{th}$ elementary coding step as modified by the corresponding puncturing.

For the same target efficiency $R_c$, a plurality of distributions of the redundancy amongst the elementary coding steps associated with the puncturing steps can therefore be envisaged.

According to the invention, the choice of a given redundancy distribution is made dynamically as a function of the transmission conditions.

In parallel to the coding procedure, a processing of observation of the transmission conditions and dynamic selection of the redundancy (see FIG. 1) analyzes, in a first step 35 (see FIG. 2), the transmission conditions. This processing measures the transmission conditions by means of one or more parameters. For example, this processing can calculate the signal to noise ratio. The analysis of transmission conditions can be carried out continuously or solely at given moments. It can be carried out each time a sequence is to be coded, or for a group of sequences or for certain particular sequences.

The parameter or parameters calculated by the transmission condition observation processing 35, such as the signal to noise ratio, enable the processing 33, in a second step, to select a redundancy distribution. The selection is made amongst a plurality of predetermined redundancy distributions satisfying equation (1) for the target efficiency $R_c$. These redundancy distributions are, for example, stored in a reference table. They can also be calculated by means of a predetermined algorithm. Each of these redundancy distributions corresponds, for a given transmission condition, to an optimum redundancy distribution, that is to say the one which leads, for example, to the best transmission performance. This performance is measured, for example, in terms of bit error rate. A prior study makes it possible to associate an optimum distribution with each value of the parameter or parameters which characterize the transmission conditions. In this way, for each given transmission condition, the processing 33 selects the optimum redundancy distribution, without modification of the target efficiency $R_c$.

FIG. 2 describes more precisely the way in which the dynamic redundancy selection step modifies the coding procedure. As stated above, the redundancies of the elementary coding steps are generally modified in two ways, which may be added to each other.

A first way of modifying the elementary coding step redundancies, depicted by step 31 in FIG. 2, consists of eliminating one or more elementary coding steps, as well as the corresponding puncturing and interleaving steps. The error correction code applied by the coding procedure is then a serial turbocode of dimension n' less than n.

A second way of modifying the elementary coding step redundancies, depicted by step 32 in FIG. 2, consists of modifying the puncturing matrices for the puncturing steps and correspondingly modifying the interleaving matrices for the interleaving steps of the coding method.

When these two ways of proceeding are combined, as shown by FIG. 2, step 31 will be executed first of all. In this way a serial turbocode of dimension n' less than or equal to n and of global efficiency R'm less than or equal to $R_m$ is obtained. Step 32 will then select the puncturing and interleaving matrices in compliance with equation (1) so that a serial turbocode of dimension n' and efficiency $R_c$ 30M is obtained.

In so far as it is wished to select the redundancy distribution best adapted for each sequence to be coded, the transmission conditions analysis step 35 will effect at least one measurement of the transmission conditions before each now sequence to be coded and, if it detects a change in the transmission conditions, steps 31 and 32 will be executed once again.

The modifications made with regard to transmission require, at reception, a corresponding modification operation.

Figure 3:
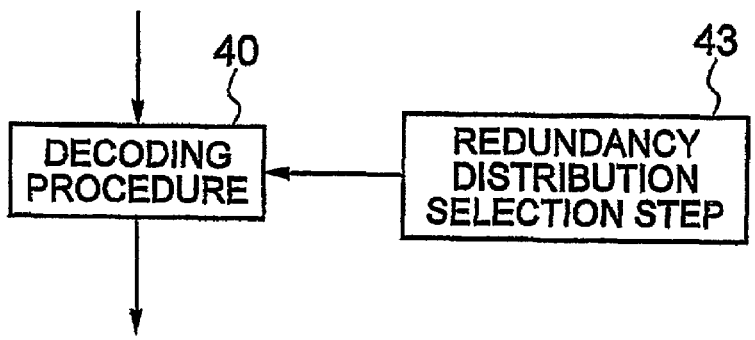
FIG. 3 is a diagram illustrating the basic principle of an embodiment of a decoding procedure of a transmission method according to the present invention.

FIG. 3 presents in schematic form the basic principle of an embodiment of a decoding procedure of a transmission method according to the present invention.

A decoding procedure 40 effects the decoding of information sequences received based on the serial turbocode used on transmission. At the outset, as can be seen in FIG. 4, it is a case of a decoding procedure 40I with n elementary decoding steps.

Figure 4:
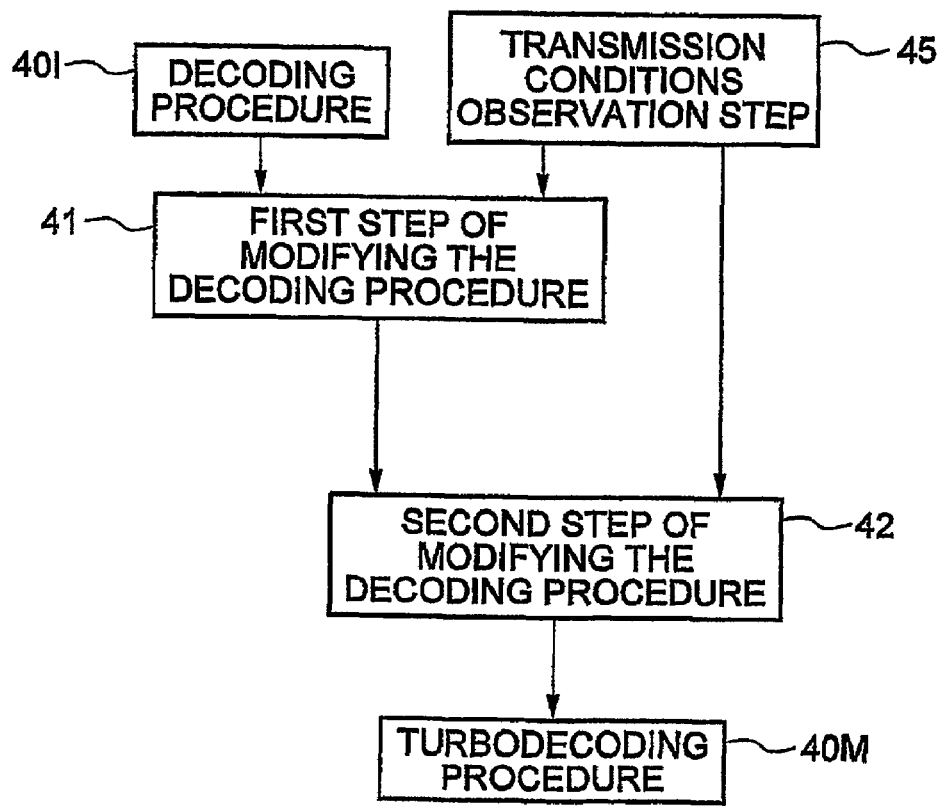
FIG. 4 is a diagram illustrating the dynamic selection of the turbodecoding scheme executed in the decoding procedure of FIG. 3.

In parallel to the decoding procedure, a processing of observation of the transmission conditions and dynamic selection of the turbodecoding scheme 43 (see FIG. 3) analyzes the transmission conditions in a first step 45 (see FIG. 4). This processing measures the transmission conditions in the same way as at transmission, so as to be able to effect a selection of a turbodecoding scheme corresponding to the coding scheme adapted on transmission. This processing of observation of the transmission conditions can be replaced by information sent by the transmitter which directly indicates the coding solution adapted on transmission. The plurality of decoding schemes corresponding to the plurality of transmission redundancy distributions can also be stored in a reference table or calculated by means of a predetermined algorithm.

FIG. 4 describes more precisely the way in which the decoding scheme dynamic selection step modifies the decoding procedure.

When the coding procedure is modified by the step 31, the decoding procedure is modified by a step 41 which consists of eliminating the elementary decoding step or steps which correspond to the elementary coding steps eliminated by the step 31, as well as the deinterleaving and depuncturing steps and the associated puncturing and interleaving steps.

The turbodecoding procedure then consists of n' elementary decoding steps, corresponding to the n' elementary coding steps of the modified coding procedure.

When the coding procedure is modified by the step 32, the decoding procedure is modified by a step 42 which consists of modifying the deinterleaving and depuncturing steps and the puncturing and interleaving steps as a function of the modifications applied to the corresponding puncturing and interleaving matrices of the coding procedure.

When these two ways of proceeding are combined, as shown by FIG. 4, step 41 will first of all be executed. In this way a turbodecoding procedure with n' elementary decoders is obtained, with n' less than or equal to n. The step 42 will then modify the deinterleaving and depuncturing steps and the puncturing and interleaving steps so that a turbodecoding procedure 40M corresponding to the turbocoding procedure 30M is obtained.

As for transmission, in so far as it is wished to select the redundancy distribution best adapted for each sequence to be coded, the transmission conditions analysis step 45, if it is independent of the transmission conditions analysis step 35, will make at least one measurement before each new sequence to be decoded and, if it detects a change in the transmission conditions, the steps 41 and 42 will be executed once again, based on the new transmission conditions.

Figure 5:
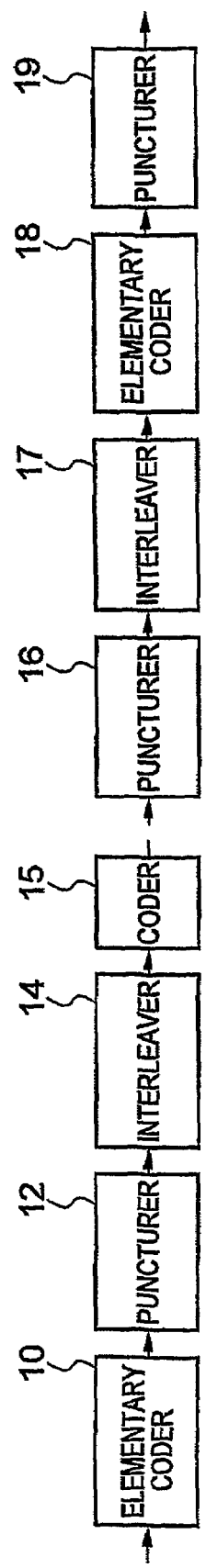
FIG. 5 is a diagram illustrating a turbocoder for an n-dimensional serial turbocode.

FIG. 5 presents a coder of the n-dimensional serial turbocoder type to which the present invention can be applied.

The serial turbocoder is formed by the serial concatenation of n elementary convolutional code or block code coders. FIG. 5 depicts the first, second and last elementary coders, respectively designated by the references 10, 15 and 18. A puncturer acting after the coder is associated with each elementary coder. In FIG. 5, the puncturers 12 and 19 correspond to the elementary coders 10 and 18. The puncturer 16 corresponds to the penultimate elementary coder, not shown. The elementary coders are separated by (n-I) interleavers. Each interleaver acts between the punctures of the preceding coder and the following coder. In FIG. 5, the interleaver 14 separates the coders 10 and 15 and the interleaver 17 separates the penultimate coder, not shown, and the coder 18.

Figure 6:
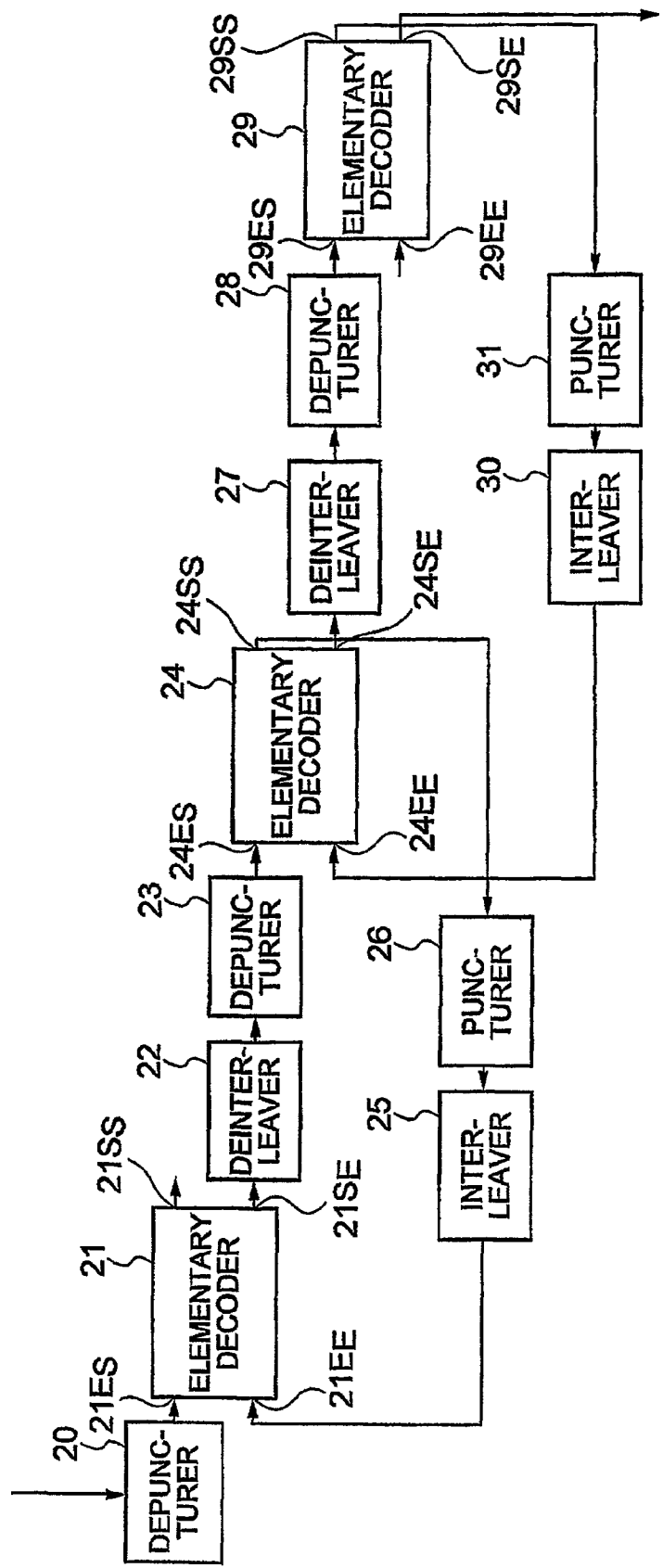
FIG. 6 is a diagram illustrating a turbodecoder for a 3-dimensional serial turbocode.

The application of the step 31 of the present invention results in the deactivation of one or more elementary coders. Deactivating an elementary coder also means deactivating the puncturer and interleavers which follow this coder. In FIG. 5, this amounts to short-circuiting the unit consisting of the coder, puncturer and interleaver, or in other words of connecting the output of the interleaver preceding this block to the input of the coder following this block. The step 32 modifies the puncturing and interleaving matrices in a suitable manner. FIG. 6 presents a turbodecoder for decoding information issuing from a serial three-dimensional coder 3.

This turbodecoder has three elementary decoders 21, 24 and 29 which correspond to the three elementary coders of the coder. Each elementary decoder has two weighted inputs and outputs. The weighted inputs, which receive a priori information, are designated by the reference of the decoder followed by the letter E. The weighted outputs, which produce a posteriori information, are designated by the reference of the decoder followed by the letter S. The weighted input whose reference is also allocated an index S receives a weighted information item which corresponds to the output of the corresponding coder. The weighted input whose reference is also allocated an index E receives weighted information which corresponds to the input of the corresponding coder. The weighted output whose reference is also allocated an index S generates weighted information which corresponds to the output of the corresponding coder.

The weighted output whose reference is also allocated an index E generates weighted information which corresponds to the input of the corresponding coder. A received sequence, after demodulation, is transmitted to a depuncturer 20 corresponding to the puncturer associated with the third and last elementary coder, and then to the input 21E$_s$ of the decoder 21 which corresponds to this third elementary coder. Within one and the same iteration, the output information 21S$_E$ from this decoder 21 is transmitted by means of a deinterleaver 22 and a depuncturer 23 to the input 24E$_s$ of an elementary decoder 24, these last three elements corresponding to the second assembly consisting of elementary coder, puncturer and interleaver of the turbocoder. Within the same iteration, the information 24S$_E$ output from the decoder 24 is transmitted by means of a deinterleaver 27 and a depuncturer 28 to the input 29E$_s$ of an elementary decoder 29, these last three elements corresponding to the first assembly consisting of elementary coder, puncturer and interleaver of the turbocoder. During a following iteration, the information 24S$_s$ output from the decoder 24 is transmitted by means of a puncturer 26 and interleaver 25, these last three elements corresponding to the second assembly consisting of elementary coder, puncturer and interleaver of the turbocoder, to the input 21E$_E$ of the decoder 21. Likewise the information 29S$_s$ output from the decoder 29 is transmitted by means of a puncturer 31 and interleaver 30, these last three elements corresponding to the first assembly consisting of elementary coder, puncturer and interleaver of the turbocoder, to the input 24E$_E$ of the decoder 24. The decision is taken, after a certain number of iterations, at the output 29S$_E$ of the decoder 29.

Application of the step 41 of the present invention results in the deactivation of one or more elementary decoders. Deactivating an elementary decoder also means deactivating the deinterleaver and depuncturer acting in the same iteration upstream of this decoder, as well as the puncturer and interleaver acting in a following iteration downstream of this decoder. For example, if the coder deactivated in the coding procedure is the second coder, in the decoding step the decoder 24, deinterleaver 22, depuncturer 23, puncturer 26 and interleaver 25 will be deactivated. In FIG. 6, this amounts to connecting the output 21S$_E$ of the decoder 21 to the interleaver 27, and the interleaver 30 to the input 21E$_E$ of the decoder 21. The step 42 suitably modifies the matrices of the remaining deinterleavers, depuncturers, puncturers and interleavers.

The invention claimed is:

1. A digital transmission method of an error correction coding, comprising:
observing transmission conditions on a communication channel continuously to detect at least one dynamic parameter of a current transmission condition on the communication channel;
selecting dynamically, as a function of the at least one dynamic parameter, a distribution of elementary coding step redundancies from a plurality of distributions of elementary coding step redundancies for which a global efficiency of a coding scheme resulting from a serial concatenation of an elementary coding step is equal to a predetermined target efficiency, said predetermined target efficiency being determined by a product of efficiencies of at least two elementary coding steps modified by corresponding puncturing steps,
corresponding with a given transmission condition, the plurality of distributions of elementary coding step redundancies are stored in a reference table, wherein each stored redundancy of the distribution coding step is characterized for optimizing the best transmission performance without modification of the target efficiency;
performing a coding procedure including the at least two elementary coding steps concatenated in series with corresponding puncturing steps, and an interleaving step between said at least two elementary coding steps, each of said at least two elementary coding steps adding at least one redundancy bit to data including a sequence of at least one bit by applying the selected distribution of elementary coding step redundancies to generate a coded data including said data and the at least one redundancy bit for a transmission of the coded data over a channel; and
performing an iterative decoding procedure including at least two elementary decoding steps, deinterleaving and depuncturing steps, and puncturing and interleaving steps corresponding to said at least two elementary decoding steps to obtain, from said coded data, an estimation of said data.

2. The digital transmission method according to claim 1, wherein said performing a coding procedure modifies said puncturing and interleaving steps, and said performing a decoding procedure modifies said deinterleaving and depuncturing, and said puncturing and interleaving steps corresponding to said at least two elementary decoding steps, as a function of said selected distribution of elementary coding step redundancies.

3. The digital transmission method according to claim 1, wherein said performing a coding procedure eliminates one or more said elementary coding steps and the corresponding puncturing and interleaving steps and said performing a decoding procedure eliminates one or more said elementary decoding steps, the deinterleaving and depuncturing steps, and the puncturing and interleaving steps corresponding to said at least two elementary decoding steps, as a function of said selected distribution of elementary coding step redundancies.

4. The digital transmission method according to claim 3, wherein said performing a coding procedure modifies remaining puncturing and interleaving steps and said performing a decoding procedure modifies remaining deinterleaving and depuncturing steps, and puncturing and interleaving steps corresponding to remaining elementary decoding steps, as a function of said selected distribution of elementary coding step redundancies.

5. The digital transmission method according to claim 1, wherein said elementary coding steps are preformed using convolutional codes.

6. The digital transmission method according to claim 1, wherein said elementary coding steps are performed using block codes.

7. The digital transmission method according to claim 1, wherein said at least one dynamic parameter is one of a bit error, a packet error rate, a signal/noise ratio, a signal to interference plus noise ratio, a number of active users of a telecommunication system, a quality of service required by a transmission system, and a speed of movement of a user of the transmission system.

8. The digital transmission method according to claim 1, wherein said observing transmission conditions and selecting a distribution of elementary coding step redundancies are executed at a transmitter, said selected distribution of elementary coding step redundancies being transmitted to a receiver.

9. The digital transmission method according to claim 1, wherein said observing transmission conditions and selecting a distribution of elementary coding step redundancies are executed at a transmitter and at a receiver.

10. The digital transmission method of claim 1, wherein said observing step is performed on a transmission side of the communication channel.

* * * * *